(12) United States Patent
Ikeda et al.

(10) Patent No.: US 12,218,178 B2
(45) Date of Patent: Feb. 4, 2025

(54) DISPLAY DEVICE

(71) Applicant: Japan Display Inc., Tokyo (JP)

(72) Inventors: Masanobu Ikeda, Tokyo (JP);
Hidemasa Yamaguchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 559 days.

(21) Appl. No.: 17/481,371

(22) Filed: Sep. 22, 2021

(65) Prior Publication Data

US 2022/0005865 A1 Jan. 6, 2022

Related U.S. Application Data

(63) Continuation of application No. PCT/JP2020/013858, filed on Mar. 26, 2020.

(30) Foreign Application Priority Data

Mar. 29, 2019 (JP) ................... 2019-068456

(51) Int. Cl.
| | | |
|---|---|---|
| *H01L 27/15* | (2006.01) | |
| *H01L 33/04* | (2010.01) | |
| *H01L 33/06* | (2010.01) | |
| *H01L 33/10* | (2010.01) | |
| *H01L 33/58* | (2010.01) | |
| *H01L 33/62* | (2010.01) | |

(52) U.S. Cl.
CPC .......... *H01L 27/156* (2013.01); *H01L 33/04* (2013.01); *H01L 33/06* (2013.01); *H01L 33/10* (2013.01); *H01L 33/58* (2013.01); *H01L 33/62* (2013.01)

(58) Field of Classification Search
None
See application file for complete search history.

(56) References Cited

U.S. PATENT DOCUMENTS

| | | | | |
|---|---|---|---|---|
| 2006/0108598 A1* | 5/2006 | Lai | ........................ | H01L 33/32 |
| | | | | 257/99 |
| 2011/0220868 A1* | 9/2011 | Choi | ...................... | H01L 33/20 |
| | | | | 438/33 |

(Continued)

FOREIGN PATENT DOCUMENTS

| | | |
|---|---|---|
| JP | 2011-527519 A | 10/2011 |
| JP | 2017-529557 A | 10/2017 |

(Continued)

OTHER PUBLICATIONS

International Search Report issued in International Patent Application No. PCT/JP2020/013858 on Jun. 2, 2020 and English translation of same. 5 pages.

(Continued)

*Primary Examiner* — Feifei Yeung Lopez
(74) *Attorney, Agent, or Firm* — K&L Gates LLP (57) ABSTRACT

A display device includes a substrate; a plurality of pixels provided on the substrate; and a plurality of inorganic light emitting elements provided on each of the pixels. The inorganic light emitting elements each include a semiconductor substrate having a first face facing the substrate and a second face provided in a convex shape on a side opposite from the first face; and a plurality of semiconductor nanowires provided on the first face, the semiconductor nanowires extending in a direction perpendicular to the first face.

12 Claims, 8 Drawing Sheets

(56) References Cited

U.S. PATENT DOCUMENTS

| | | |
|---|---|---|
| 2011/0254034 A1 | 10/2011 | Konsek et al. |
| 2014/0239327 A1 | 8/2014 | Konsek et al. |
| 2015/0009649 A1* | 1/2015 | Jagt ................ F21K 9/64 362/230 |
| 2015/0207038 A1* | 7/2015 | Hwang ............ H01L 33/405 257/88 |
| 2016/0013366 A1* | 1/2016 | Hwang ............ H01L 33/08 257/13 |
| 2016/0056336 A1* | 2/2016 | Hwang ............ H01L 33/24 257/9 |
| 2016/0093665 A1* | 3/2016 | Schubert .......... H01L 33/507 438/34 |
| 2017/0162746 A1* | 6/2017 | Cha ................ H01L 33/385 |
| 2017/0213502 A1 | 7/2017 | Henry et al. |
| 2017/0279017 A1 | 9/2017 | Konsek et al. |
| 2017/0323925 A1 | 11/2017 | Schneider, Jr. et al. |
| 2017/0373118 A1 | 12/2017 | Hugon |
| 2018/0198047 A1* | 7/2018 | Danesh ............ H01L 33/60 |
| 2019/0088820 A1 | 3/2019 | Danesh et al. |
| 2019/0221731 A1 | 7/2019 | Konsek et al. |
| 2019/0326478 A1* | 10/2019 | Danesh ............ H01L 33/62 |
| 2020/0126477 A1 | 4/2020 | Henry et al. |
| 2021/0313497 A1* | 10/2021 | Pourquier ........ H01L 33/005 |

FOREIGN PATENT DOCUMENTS

| | | |
|---|---|---|
| JP | 2018-503258 A | 2/2018 |
| JP | 2019-012744 A | 1/2019 |

OTHER PUBLICATIONS

Written Opinion issued in International Patent Application No. PCT/JP2020/013858 on Jun. 2, 2020. 4 pages.

Office Action issued in related Chinese Patent Application No. 202080022360.5 on Oct. 28, 2022 and English translation of same. 16 pages.

* cited by examiner

DISPLAY DEVICE

CROSS-REFERENCE TO RELATED APPLICATION

This application claims the benefit of priority from Japanese Patent Application No. 2019-068456 filed on Mar. 29, 2019 and International Patent Application No. PCT/JP2020/013858 filed on Mar. 26, 2020, the entire contents of which are incorporated herein by reference.

BACKGROUND

1. Technical Field

What is disclosed herein relates to a display device.

2. Description of the Related Art

In recent years displays including micro-sized light emitting diodes (micro LEDs) as display elements have been gaining attention (refer to Japanese Patent Application Laid-open Publication (Translation of PCT Application) No. 2017-529557 (JP-A-2017-529557), for example). The light emitting diodes are coupled to an array substrate (a driver back plane in JP-A-2017-529557), in which the array substrate includes a pixel circuit for driving the light emitting diodes, or an electronic control circuit in JP-A-2017-529557. A nanowire LED is known as the micro-sized light emitting diodes (refer to Japanese Patent Application Laid-open Publication (Translation of PCT Application) No. 2011-527519, for example). The nanowire LED includes a plurality of semiconductor nanowires grown on a semiconductor substrate.

The nanowire LED has a peak of light intensity in a direction inclined with respect to a direction perpendicular to the semiconductor substrate. Thus, there is a possibility that when the nanowire LED is used for a display device, the efficiency of extracting light emitted from the nanowire LED may decrease.

There is a need for a display device with improved efficiency of extracting light.

SUMMARY

According to an aspect, a display device includes a substrate; a plurality of pixels provided on the substrate; and a plurality of inorganic light emitting elements provided on each of the pixels. The inorganic light emitting elements each include a semiconductor substrate having a first face facing the substrate and a second face provided in a convex shape on a side opposite from the first face; and a plurality of semiconductor nanowires provided on the first face, the semiconductor nanowires extending in a direction perpendicular to the first face.

DETAILED DESCRIPTION

The following describes aspects (embodiments) to perform the present disclosure in detail with reference to the accompanying drawings. The details described in the following embodiments do not limit the present disclosure. The components described in the following include components that can easily be thought of by those skilled in the art and components that are substantially the same. Further, the components described in the following can be combined with one another as appropriate. The disclosure is only by way of example, and some appropriate modifications with the gist of the disclosure maintained that can easily be thought of by those skilled in the art are naturally included in the scope of the present disclosure. The drawings may be represented more schematically for the width, thickness, shape, and the like of parts than those of actual aspects in order to make the description clearer; they are only by way of example and do not limit the interpretation of the present disclosure. In the present specification and drawings, components similar to those previously described for the drawings previously described are denoted by the same symbols, and a detailed description may be omitted as appropriate.

First Embodiment

Figure 1:
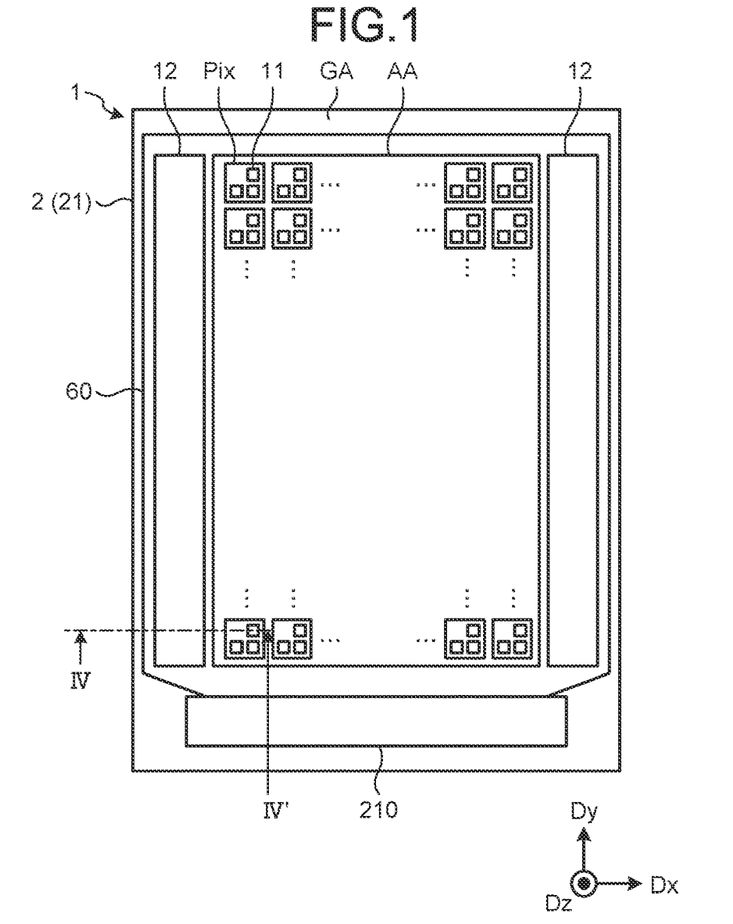
FIG. 1 is a plan view schematically illustrating a display device according to a first embodiment.

FIG. 1 is a plan view schematically illustrating a display device according to a first embodiment. As illustrated in FIG. 1, this display device 1 includes an array substrate 2, pixels Pix, a drive circuit 12, a drive integrated circuit (IC) 210, and a cathode wire 60. The array substrate 2 is a drive circuit substrate for driving the pixels Pix and is also referred to as a back plane or an active matrix substrate. The array substrate 2 has a substrate 21, a plurality of transistors, a plurality of capacitances, various kinds of wires, and the like.

As illustrated in FIG. 1, the display device 1 has a display area AA and a peripheral area GA. The display area AA is an area that is placed so as to overlap with the pixels Pix and that displays images. The peripheral area GA is an area not overlapping with the pixels Pix and is placed outside the display area AA.

The pixels Pix are arranged in a first direction Dx and a second direction Dy in the display area AA of the substrate 21. In the present specification, the first direction Dx and the second direction Dy are directions parallel to a surface of the substrate 21. The first direction Dx is orthogonal to the second direction Dy. However, the first direction Dx may cross the second direction Dy without being orthogonal thereto. A third direction Dz is a direction orthogonal to the first direction Dx and the second direction Dy. The third direction Dz corresponds to the normal direction of the substrate 21, for example. In the following, "a plan view" indicates a positional relation when viewed in the third direction Dz.

The drive circuit 12 is a circuit driving a plurality of gate lines (a light emission control scan line BG, a reset control scan line RG, an initialization control scan line IG, and a writing control scan line SG (refer to FIG. 3), for example) based on various kinds of control signals from the drive IC 210. The drive circuit 12 selects the gate lines successively or simultaneously and supplies a gate drive signal to a selected gate line. Thus, the drive circuit 12 selects the pixels Pix coupled to the gate line.

The drive IC 210 is a circuit controlling the display of the display device 1. The drive IC 210 is mounted as a chip on glass (COG) in the peripheral area GA of the substrate 21. This is not limiting, and the drive IC 210 may be mounted as a chip on film (COF) on a wiring board coupled to the peripheral area GA of the substrate 21. The wiring board coupled to the substrate 21 is a flexible printed board or a rigid board, for example.

The cathode wire 60 is provided in the peripheral area GA of the substrate 21. The cathode wire 60 is provided so as to surround the pixels Pix of the display area AA and the drive circuit 12 of the peripheral area GA. Cathodes of a plurality of light emitting elements 3 are electrically coupled to the common cathode wire 60, and a fixed potential (a ground potential, for example) is supplied thereto. More specifically, a cathode terminal 38 of a light emitting element 3 (refer to FIG. 4) is coupled to the cathode wire 60 via a cathode electrode 23. The cathode wire 60 may have a slit therein to be formed as two different wires on the substrate 21.

Figure 2:
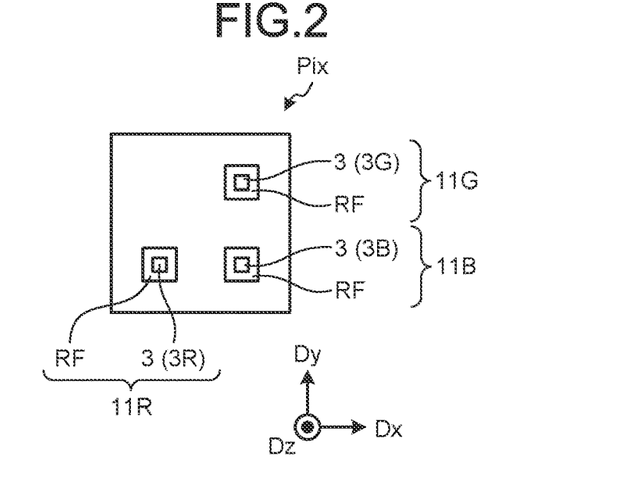
FIG. 2 is a plan view of a plurality of pixels.

FIG. 2 is a plan view of a pixel including a plurality of pixels. As illustrated in FIG. 2, one pixel Pix includes a plurality of pixels 11. The pixel Pix has a first pixel 11R, a second pixel 11G, and a third pixel 11B, for example. The first pixel 11R displays a primary color red as a first color. The second pixel 11G displays a primary color green as a second color. The third pixel 11B displays a primary color blue as a third color. In the following, when there is no need to discriminate the first pixel 11R, the second pixel 11G, and the third pixel 11B from one another, they are referred to as a pixel 11.

The pixel 11 has each of light emitting elements 3R, 3G, and 3B and a reflective plate RF. In the following description, when there is no need to describe the light emitting elements 3R, 3G, and 3B in a discriminated manner, they are represented simply as a light emitting element 3. The display device 1 emits light different for the light emitting elements 3R, 3G, and 3B (red, green, and blue light, for example) in the first pixel 11R, the second pixel 11G, and the third pixel 11B, respectively, to display an image.

The light emitting element 3 is provided for each of the pixels Pix. The light emitting element 3 is an inorganic light emitting diode (LED) chip having a size of approximately a few micrometers to 300 μm in a plan view; in general, an element with a single size of 100 μm or more is a miniLED, whereas an element with a size of a few micrometers or more and less than 100 μm is a micro LED. In the present disclosure, the LEDs of both sizes can be used; they may be used separately in accordance with a screen size (the size of one pixel) of the display device 1. The display device 1 including the micro LED in each pixel is also referred to as a micro LED display device. Micro of the micro LED does not limit the size of the light emitting element 3.

As illustrated in FIG. 2, in one pixel Pix, the first pixel 11R and the third pixel 11B are arranged in the first direction Dx. The second pixel 11G and the third pixel 11B are arranged in the second direction Dy. The first color, the second color, and the third color are not limited to red, green, and blue, respectively; any color such as complementary colors may be selected. The light emitting elements 3R, 3G, and 3B may emit different light beams of four or more colors. The placement of the pixels 11 is not limited to the configuration illustrated in FIG. 2. The first pixel 11R may be adjacent to the second pixel 11G in the first direction Dx, for example. The first pixel 11R, the second pixel 11G, and the third pixel 11B may be arranged repeatedly in the first direction Dx in this order.

Figure 3:
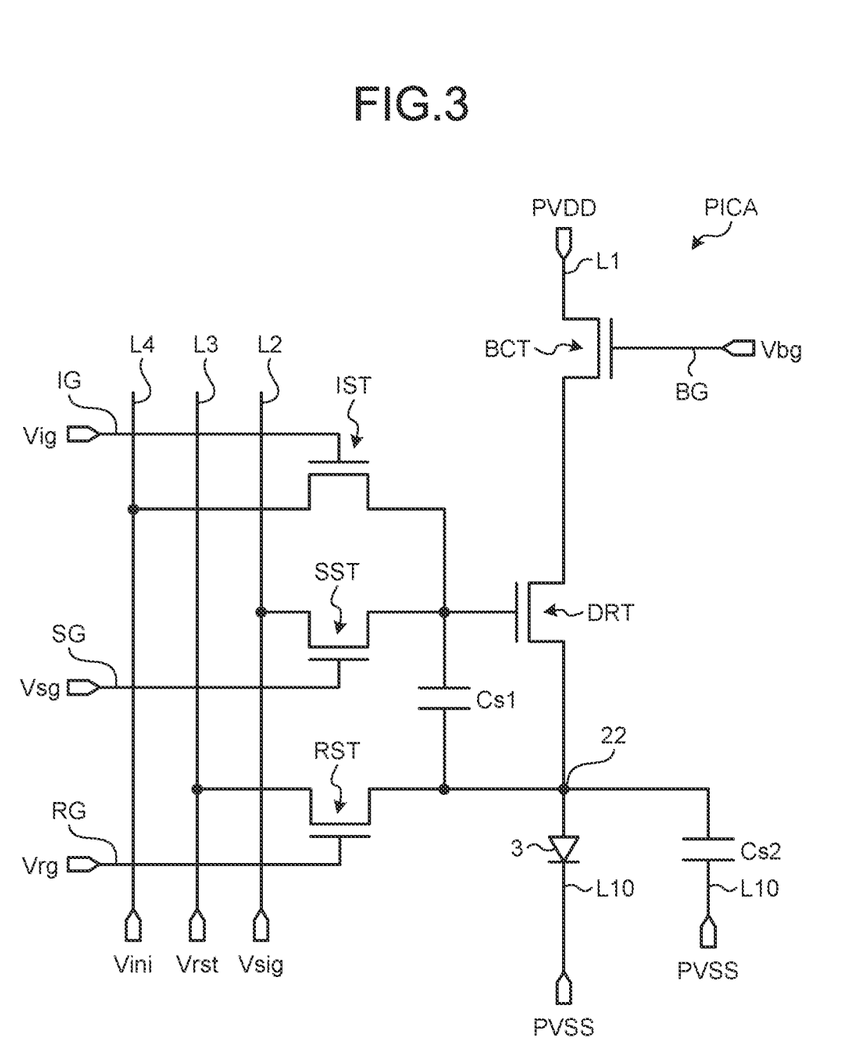
FIG. 3 is a circuit diagram of a pixel circuit.

FIG. 3 is a circuit diagram of a pixel circuit. This pixel circuit PICA illustrated in FIG. 3 is provided for each of the first pixel 11R, the second pixel 11G, and the third pixel 11B. The pixel circuit PICA is a circuit provided on the substrate 21 to supply a drive signal (current) to the light emitting elements 3R, 3G, and 3B. In FIG. 3, a description for the pixel circuit PICA can be used for the pixel circuit PICA of each of the first pixel 11R, the second pixel 11G, and the third pixel 11B.

As illustrated in FIG. 3, the pixel circuit PICA includes the light emitting element 3 (the light emitting elements 3R, 3G, and 3B), five transistors, and two capacitors. Specifically, the pixel circuit PICA includes a light emission control transistor BCT, an initialization transistor IST, a writing transistor SST (a second transistor), a reset transistor RST, and a drive transistor DRT (a first transistor). Partial transistors may be shared by the pixels 11 adjacent to each other.

The transistors of the pixel circuit PICA each include an n-type thin film transistor (TFT). However, this is not limiting, and each of the transistors may include a p-type TFT.

The light emission control scan line BG is coupled to a gate of the light emission control transistor BCT. The initialization control scan line IG is coupled to a gate of the initialization transistor IST. The writing control scan line SG is coupled to a gate of the writing transistor SST. The reset control scan line RG is coupled to a gate of the reset transistor RST.

The light emission control scan line BG, the initialization control scan line IG, the writing control scan line SG, and the reset control scan line RG are coupled to the respective drive circuit 12 (refer to FIG. 1). The drive circuit 12 supplies a light emission control signal Vbg, an initialization control signal Vig, a writing control signal Vsg, and a reset control signal Vrg to the light emission control scan line BG, the initialization control scan line IG, the writing control scan line SG, and the reset control scan line RG, respectively.

The drive IC 210 (refer to FIG. 1) supplies a video signal Vsig to the pixel circuit PICA of each of the first pixel 11R, the second pixel 11G, and the third pixel 11B in a time-division manner. A switch circuit such as a multiplexer is provided between each column of the first pixel 11R, the second pixel 11G, and the third pixel 11B and the drive IC 210. The video signal Vsig is supplied to the writing transistor SST via a video signal line L2. The drive IC 210 supplies a reset power supply potential Vrst to the reset transistor RST via a reset signal line L3. The drive IC 210 supplies an initialization potential Vini to the initialization transistor IST via an initialization signal line L4.

The light emission control transistor BCT, the initialization transistor IST, the writing transistor SST, and the reset transistor RST function as switching elements selecting conduction or non-conduction between two nodes. The drive transistor DRT functions as a current control element controlling a current passing through the light emitting element 3 in accordance with a voltage between its gate and drain.

The cathode of the light emitting element 3, or the cathode terminal 38, is coupled to a cathode power supply line L10. An anode of the light emitting element 3, or a contact layer 37, is coupled to an anode power supply line L1 via the drive transistor DRT and the light emission control transistor BCT. An anode power supply potential PVDD is supplied to the anode power supply line L1. A cathode power supply potential PVSS is supplied to the cathode power supply line L10. The anode power supply potential PVDD is a potential higher than the cathode power supply potential PVSS. The cathode power supply line L10 includes the cathode wire 60.

The pixel circuit PICA includes a capacitor Cs1 and a capacitor Cs2. The capacitor Cs1 is a capacitor formed between the gate and a source of the drive transistor DRT. The capacitor Cs2 is an additional capacitor formed between the source of the drive transistor DRT and the anode of the light emitting element 3 and the cathode power supply line L10.

In a reset period, the light emission control transistor BCT is turned off (a non-conduction state), whereas the reset transistor RST is turned on (a conduction state) in accordance with the potential of the light emission control scan line BG and the reset control scan line RG. Thus, the source of the drive transistor DRT is fixed to the reset power supply potential Vrst. The reset power supply potential Vrst is a potential giving a potential difference between the reset power supply potential Vrst and the cathode power supply potential PVSS smaller than a potential difference at which the light emitting element 3 starts light emission.

Next, the initialization transistor IST is turned on in accordance with the potential of the initialization control scan line IG. The gate of the drive transistor DRT is fixed to the initialization potential Vini via the initialization transistor IST. The drive circuit 12 turns on the light emission control transistor BCT and turns off the reset transistor RST. The drive transistor DRT is turned off when its source potential becomes (Vini-Vth), and variations in the threshold voltage Vth of the drive transistor DRT of each of the pixels 11 are offset.

Next, in a video signal writing operation period, the light emission control transistor BCT is turned off, the initialization transistor IST is turned off, and the writing transistor SST is turned on. The video signal Vsig is input to the gate of the drive transistor DRT.

Next, in a light emission operation period, the light emission control transistor BCT is turned on, whereas the writing transistor SST is turned off. The anode power supply potential PVDD is supplied to the drive transistor DRT from the anode power supply line L1 via the light emission control transistor BCT. The drive transistor DRT supplies a current corresponding to a voltage between its gate and source to the light emitting element 3. The light emitting element 3 emits light with luminance according to this current.

The configuration of the pixel circuit PICA illustrated in FIG. 3 described above is only by way of example and can be changed as appropriate. The number of wires and the number of transistors per one pixel 11 may vary, for example.

Figure 4:
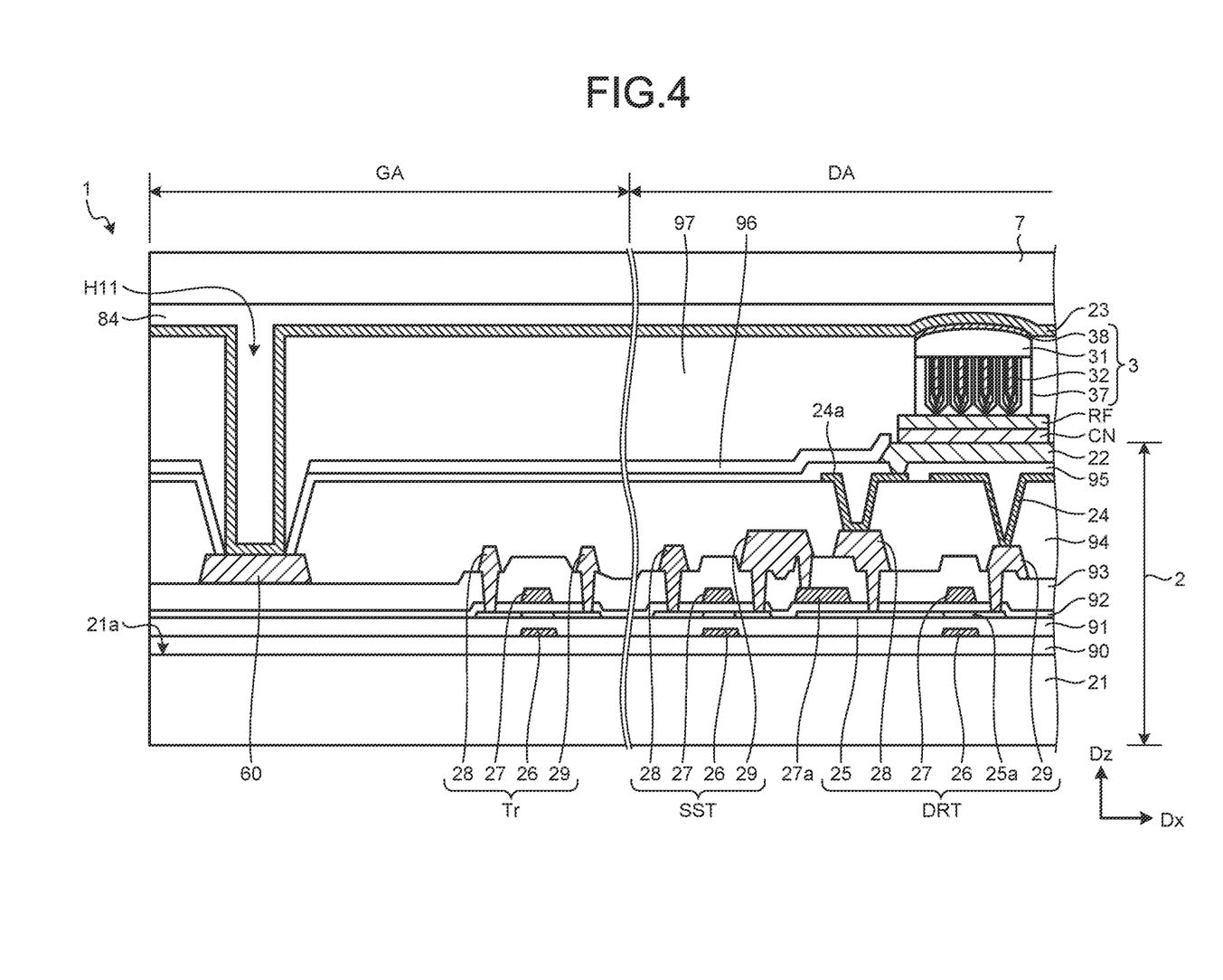
FIG. 4 is a IV-IV' sectional view of FIG. 1.

The following describes a sectional configuration of the display device 1. FIG. 4 is a IV-IV' sectional view of FIG. 1. As illustrated in FIG. 4, in the display device 1, the light emitting element 3 is provided on the array substrate 2. The array substrate 2 has the substrate 21, an anode electrode 22, a counter electrode 24, a coupling electrode 24a, the reflective plate RF, a coupling layer CN, various kinds of transistors, various kinds of wires, and various kinds of insulating films.

The substrate 21 is an insulating substrate, and a glass substrate such as quartz or non-alkali glass or a resin substrate such as polyimide is used therefor, for example.

In the present specification, a direction toward the light emitting element 3 from the substrate 21 in the directions perpendicular to the surface of the substrate 21 is referred to as "upper side" or simply as "upper." A direction toward the substrate 21 from the light emitting element 3 is referred to as "lower side" or simply as "lower." In representing a mode in which another structure is placed on the upper side of one structure, a case referred to simply as "on the upper side" includes both a case in which the other structure is placed immediately above the one structure so as to be in contact therewith and a case in which the other structure is placed above the one structure via still another structure unless otherwise specified.

An undercoat film 90 is provided on the substrate 21. The undercoat film 90, insulating films 91, 92, and 93, and insulating films 95 and 96 are inorganic insulating films and are each silicon oxide ($SiO_2$) or silicon nitride (SiN), for example.

The drive transistor DRT is provided on the undercoat film 90. Although FIG. 4 illustrates the drive transistor DRT and the writing transistor SST among the transistors, the light emission control transistor BCT, the initialization transistor IST, and the reset transistor RST included in the pixel circuit PICA also each have a multilayered structure similar to that of the drive transistor DRT. The peripheral area GA is provided with a transistor Tr included in the drive circuit 12.

The drive transistor DRT has a semiconductor layer 25, a first gate electrode 26, a second gate electrode 27, a source electrode 28, and a drain electrode 29. The first gate electrode 26 is provided on the undercoat film 90. The insulating film 91 covering the first gate electrode 26 is provided on the undercoat film 90. The semiconductor layer 25 is provided on the insulating film 91. For the semiconductor layer 25, polysilicon is used, for example. However, this is not limiting, and the semiconductor layer 25 may be a microcrystal oxide semiconductor, an amorphous oxide semiconductor, a low temperature polysilicon, or the like.

The insulating film 92 covering the semiconductor layer 25 is provide on the insulating film 91. The second gate electrode 27 is provided on the insulating film 92. In the semiconductor layer 25, a channel area 25a is provided in a portion between the first gate electrode 26 and the second gate electrode 27.

A first wiring layer 27a is provided on the same layer as the second gate electrode 27. The first gate electrode 26, the second gate electrode 27, and the first wiring layer 27a are each formed of aluminum (Al), copper (Cu), silver (Ag), molybdenum (Mo), or an alloy film of these, for example. The drive transistor DRT has a dual gate structure, in which the first gate electrode 26 and the second gate electrode 27 are provided. However, this is not limiting, and the drive transistor DRT may have a bottom gate structure, in which only the first gate electrode 26 is provided, or a top gate structure, in which only the second gate electrode 27 is provided.

The source electrode 28 and the drain electrode 29 are coupled to the semiconductor layer 25 via respective contact holes provided in the insulating films 92 and 93. The source electrode 28 and the drain electrode 29 are each a multilayered film of TiAlTi or TiAl as a multilayered structure of titanium and aluminum, for example.

The first wiring layer 27a and the source electrode 28 facing each other with the insulating film 93 interposed therebetween form the capacitor Cs1. The capacitor Cs1 also includes a capacitor including the semiconductor layer 25 and the first wiring layer 27a facing each other with the insulating film 92 interposed therebetween.

Although FIG. 4 describes the configuration of the drive transistor DRT among the transistors, the transistors included in the pixel circuit PICA such as the writing transistor SST and the transistor Tr provided in the peripheral area GA also each have a sectional structure similar to that of the drive transistor DRT, and detailed descriptions thereof are omitted.

The insulating film 94 covering the drive transistor DRT is provided on the insulating film 93. For the insulating film 94, an organic material such as photosensitive acrylic is used. The insulating film 94 is a flattening film and can flatten recesses and protrusions formed by the drive transistor DRT and the various kinds of wires.

The counter electrode 24, the insulating film 95, the anode electrode 22, and the insulating film 96 are layered in this order on the insulating film 94. The counter electrode 24 includes a conductive material having translucency such as indium tin oxide (ITO), for example. The coupling electrode 24a is provided on the same layer as the counter electrode 24. The coupling electrode 24a is coupled to the source electrode 28 at the bottom of a contact hole provided in the insulating film 94.

The anode electrode 22 is electrically coupled to the coupling electrode 24a and the source electrode 28 via a contact hole provided in the insulating film 95. Thus, the anode electrode 22 is electrically coupled to the drive transistor DRT. The anode electrode 22 has a multilayered structure of molybdenum (Mo) and aluminum (Al), for example.

The capacitor Cs2 is formed between the anode electrode 22 and the counter electrode 24 facing each other with the insulating film 95 interposed therebetween. The insulating film 96 is provided so as to cover the anode electrode 22. The insulating film 96 covers a peripheral part of the anode electrode 22 and insulates anode electrodes 22 of the pixels 11 adjacent to each other from each other.

The insulating film 96 has an opening for mounting the light emitting element 3 at a position overlapping with the anode electrodes 22. In the area of the opening of the insulating film 96, the coupling layer CN and the reflective plate RF are provided on the anode electrodes 22.

The coupling layer CN is a low melting point metal such as tin (Sn) or indium (In) and electrically couples the reflective plate RF and the anode electrode 22 to each other. The reflective plate RF is silver (Ag) or aluminum (Al). However, the materials of the coupling layer CN and the reflective plate RF are not limiting; other metals or alloys may be used.

The light emitting element 3 has a semiconductor substrate 31, semiconductor nanowires 32, the contact layer 37, and the cathode terminal 38. The semiconductor nanowires 32 each have a nanostructure with a dimension in a plan view of 1 pm or less and have a length in the third direction Dz sufficiently larger than a width in the first direction Dx. The light emitting element 3 is mounted with the contact layer 37 being in contact with the reflective plate RF. The anode electrode 22 supplies the anode power supply potential PVDD to respective p-type semiconductors 35 of the semiconductor nanowires 32 via the coupling layer CN, the reflective plate RF, and the contact layer 37.

An element insulating film 97 is provided between the light emitting elements 3. The element insulating film 97 is formed of a resin material. The element insulating film 97 covers at least side faces of the light emitting element 3, and the element insulating film 97 is not provided on the cathode terminal 38 of the light emitting element 3. An upper face of the element insulating film 97 is coupled to an outer edge of the cathode terminal 38 to be formed to be flat.

The cathode electrode 23 covering the light emitting elements 3 and the element insulating film 97 is electrically coupled to the light emitting elements 3. More specifically, the cathode electrode 23 is provided across the upper face of the element insulating film 97 and an upper face of the cathode terminal 38. The cathode electrode 23 supplies the cathode power supply potential PVSS to the cathode terminal 38. The cathode electrode 23 is a translucent conductive film; an ITO is used therefor, for example. Thus, emitted light from the light emitting element 3 can efficiently be extracted to the outside.

The cathode electrode 23 is coupled to the cathode wire 60 provided on the array substrate 2 via a contact hole H11 provided outside the display area AA. Specifically, the contact hole H11 is provided in the element insulating film 97 and the insulating film 94, and the cathode wire 60 is provided on a bottom face of the contact hole H11. The cathode wire 60 is provided on the insulating film 93. That is to say, the cathode wire 60 is provided on the same layer as the source electrode 28 and the drain electrode 29 and is formed of the same material as that thereof. The cathode electrode 23 is provided continuously from the display area AA to the peripheral area GA and is coupled to the cathode wire 60 at the bottom of the contact hole H11.

A circularly polarizing plate 7 is provided above the cathode electrode 23 via an adhesive layer 84. In other words, the light emitting elements 3 are provided between the substrate 21 and the circularly polarizing plate 7 in the direction perpendicular to the substrate 21. The circularly polarizing plate 7 includes a linearly polarizing plate and a quarter phase difference plate (also referred to as a quarter-wave plate) provided on one side of the linearly polarizing plate, for example. The quarter phase difference plate is provided closer to the substrate 21 than the linearly polarizing plate is.

External light (incident light) passes through the linearly polarizing plate to be changed to linearly polarized light, for example. The linearly polarized light passes through the quarter phase difference plate to be changed to circularly polarized light. The circularly polarized light is reflected by the wiring of the array substrate 2 to be circularly polarized light with rotation opposite to that of the incident light, or reflected light. The reflected light again passes through the quarter phase difference plate to be linearly polarized light orthogonal to that of the incident one and is absorbed by the linearly polarizing plate. Thus, the display device 1 inhibits the reflection of the external light.

Figure 5:
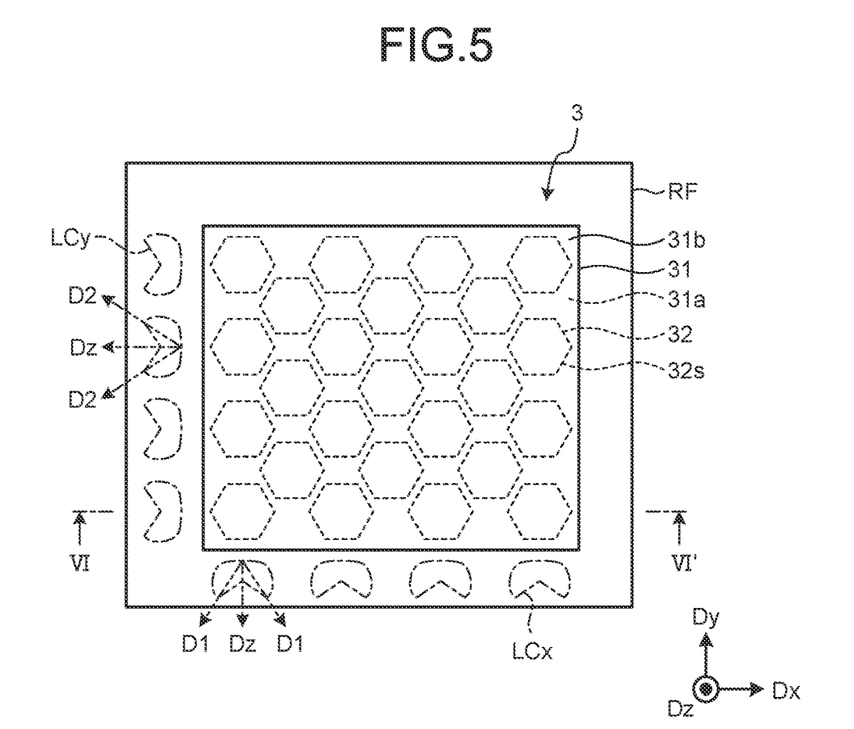
FIG. 5 is a plan view of a light emitting element.

The following describes a detailed configuration of the light emitting element 3. FIG. 5 is a plan view of the light emitting element. As illustrated in FIG. 5, the semiconductor substrate 31 of the light emitting element 3 has a rectangular shape in a plan view. The semiconductor substrate 31 includes n-type GaN, for example. The semiconductor nanowires 32 each have a hexagonal shape in a plan view. The semiconductor nanowires 32 are grown on the c plane of n-type GaN to be formed in a hexagonal prismatic shape having six side faces 32s corresponding to the m planes of n-type GaN. Although FIG. 5 illustrates an arrangement of 25 semiconductor nanowires 32 in order to make the drawing easy to be seen, the number of the semiconductor nanowires 32 placed in one light emitting element 3 is not limited to this example, and two or more semiconductor nanowires 32 may be provided.

FIG. 5 schematically illustrates light distribution characteristics LCx and LCy of the semiconductor nanowires 32. The light distribution characteristic LCx indicates a light distribution characteristic of the semiconductor nanowires 32 on a plane defined by the first direction Dx and the third direction Dz. The light distribution characteristic LCy indicates a light distribution characteristic of the semiconductor nanowires 32 on a plane defined by the second direction Dy and the third direction Dz. The semiconductor nanowires 32 have a peak of light emission intensity in directions D1 and D2, which are inclined with respect to the third direction Dz.

The semiconductor nanowires 32 are placed in a zigzag or staggered manner so that the side faces 32s face each other. In other words, the semiconductor nanowires 32 are arranged in a triangular grid. With such placement, light of one semiconductor nanowire 32 in the third direction Dz and light in the directions D1 and D2, in which other semiconductor nanowires 32 have the peak of light emission intensity, overlap with each other. Thus, the light emitting element 3 complements the light of the semiconductor nanowires 32 in the third direction Dz to have a peak of light emission intensity at a central part of the semiconductor substrate 31 as a whole.

Figure 6:
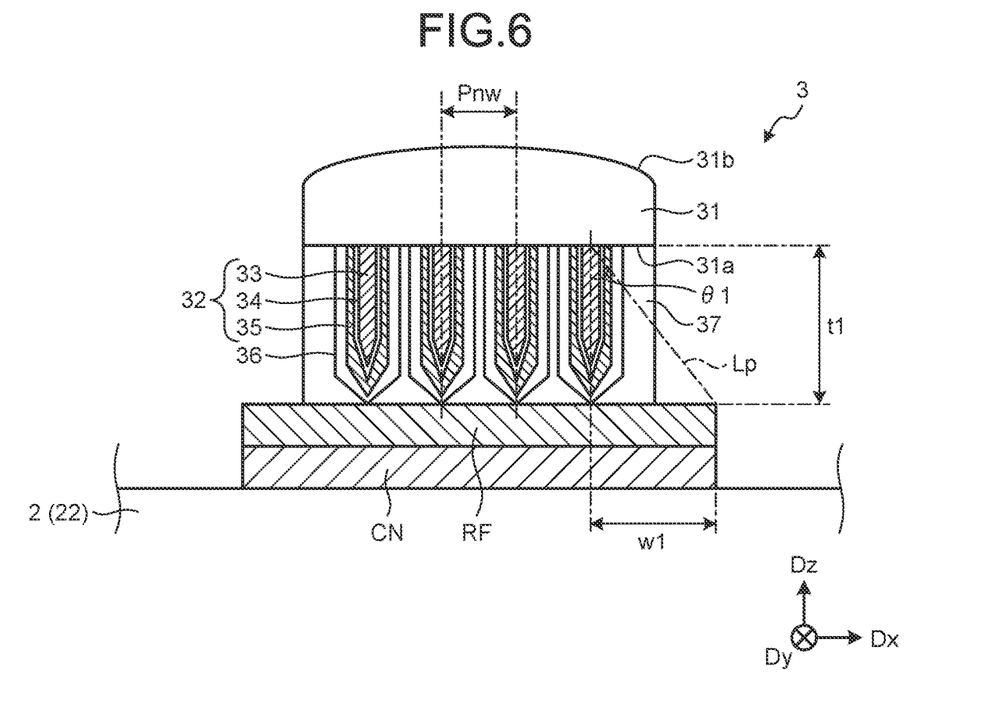
FIG. 6 is a VI-VI' sectional view of FIG. 5.

FIG. 6 is a VI-VI' sectional view of FIG. 5. As illustrated in FIG. 6, the semiconductor substrate 31 has a first face 31a and a second face 31b on a side opposite from the first face 31a. The first face 31a faces the array substrate 2. In other words, the first face 31a faces the substrate 21. The second face 31b is provided in a convex shape on the side opposite from the first face 31a. The second face 31b has a shape having a curved face curved in a convex shape in the third direction Dz. The light emitted from the semiconductor nanowires 32 in the third direction Dz passes through the second face 31b of the semiconductor substrate 31. The travel direction of the light is directed to a direction parallel to the third direction Dz in accordance with the difference in the refractive index between the semiconductor substrate 31 and the cathode electrode 23. Thus, light diffusing in a direction from the central part toward a peripheral part of the semiconductor substrate 31 can be reduced, and thus the semiconductor nanowires 32 can reduce a reduction in light emission intensity at the central part of the semiconductor substrate 31 as a whole.

The method for producing the second face 31b of the semiconductor substrate 31 is not limited to a particular method. The semiconductor substrate 31 is formed on a sapphire substrate having a patterned surface, and the sapphire substrate is removed, whereby the convex shape of the second face 31b can be formed, for example. The shape of the second face 31b can be changed as appropriate. Although the entire second face 31b includes a curved face, a protruding part having a curved face may be formed in part of the second face 31b, for example.

The semiconductor nanowires 32 are provided on the first face 31a of the semiconductor substrate 31 and extend in the third direction Dz. The semiconductor nanowires 32 each have an n-type semiconductor 33, an active layer 34, and a p-type semiconductor 35. The semiconductor nanowires 32 each function as a light emitting element and are electrically coupled to the anode electrode 22 and the cathode electrode 23 as common electrodes to be configured as one light emitting element 3 as a whole.

The n-type semiconductor 33 is a columnar nanowire grown on the semiconductor substrate 31 and is n-type GaN, for example. The active layer 34 covering at least a side face of the n-type semiconductor 33 is provided between the n-type semiconductor 33 and the p-type semiconductor 35. As the active layer 34, a multi-quantum well structure (MQW structure), in which a well layer and a barrier layer each formed of a layer of a few atoms are periodically layered on each other, may be employed for increased efficiency. The active layer 34 is preferably provided so as to cover the side face and a lower end part of the n-type semiconductor 33. Thus, the area of the active layer 34 can be ensured.

The p-type semiconductor 35 is provided facing at least side faces of the n-type semiconductor 33 and the active layer 34. The p-type semiconductor 35 is preferably provided so as to cover the side face and a lower end part of the active layer 34. The p-type semiconductor 35 is p-type GaN, for example. The material of the semiconductor nanowires 32 is not limited to GaN and may be a compound semiconductor such as aluminum indium gallium phosphorous (AlInGaP), aluminum gallium arsenic (AlGaAs), or gallium arsenic phosphorous (GaAsP).

Protective layers 36 are provided so as to cover the respective p-type semiconductors 35. The contact layer 37 covering the semiconductor nanowires 32 and the protective layers 36 is provided on the first face 31a of the semiconductor substrate 31. The p-type semiconductors 35 of the semiconductor nanowires 32 are electrically coupled to the reflective plate RF via the protective layers 36 and the contact layer 37. Although in FIG. 6 lower end parts of the protective layers 36 are in contact with the reflective plate RF, this is not limiting. The contact layer 37 may be provided so as to cover the lower end parts of the protective layers 36.

As the material of the protective layers 36, a transition metal oxide is used. Examples of the transition metal oxide include materials containing one or two or more of a tungsten oxide ($WO_3$), a molybdenum oxide ($MoO_3$), a vanadium oxide ($V_2O_5$), nickel oxides ($NiO_x$), a rhenium oxide ($ReO_3$), and a ruthenium oxide ($RuO_2$). For the contact layer 37, a translucent conductive material such as ITO is used. The transition metal oxide forming the protective layers 36 has a higher work function than that of ITO forming the contact layer 37. Thus, contact resistance between the reflective plate RF as a metal layer and the p-type semiconductors 35 is reduced, and thus the light emitting element 3 and the reflective plate RF can favorably electrically be coupled to each other.

An arrangement pitch of the semiconductor nanowires 32 in the first direction Dx is an arrangement pitch Pnw. The arrangement pitch Pnw is a spacing between the centers of bottom faces (faces in contact with the first face 31a) of n-type semiconductors 33. A virtual line Lp is a virtual line passing through the center of the bottom face of the n-type semiconductor 33 and parallel to a direction in which the semiconductor nanowires 32 have the peak of light emission intensity, or the D1 direction illustrated in FIG. 5, for example.

An angle θ1 is an angle formed by the third direction Dz and the virtual line Lp. That is to say, the angle θ1 is an angle at which the light emission intensity of the semiconductor nanowires 32 is maximized. The angle θ1 is approximately 23° to 33°, for example. However, the angle θ1 can be varied values in accordance with the refractive indices of the materials provided around the semiconductor nanowires 32 such as the protective layers 36, the contact layer 37, and the element insulating film 97.

The width of the reflective plate RF in the first direction Dx is (the arrangement pitch Pnw)×(the number of the semiconductor nanowires 32−1)+(2×W1). The width W1 is represented by W1=t1×tanθ1. The height t1 is the height of the semiconductor nanowires 32 and is the distance between the first face 31a of the semiconductor substrate 31 and an upper face of the reflective plate RF in the third direction Dz. Thus, light emitted in an oblique direction toward the array substrate 2 from the semiconductor nanowires 32 is reflected by the reflective plate RF to be emitted toward a display face. Thus, the display device 1 can extract the light emitted toward the array substrate 2 as display light in addition to light emitted toward the upper side from the semiconductor nanowires 32.

Figure 7:
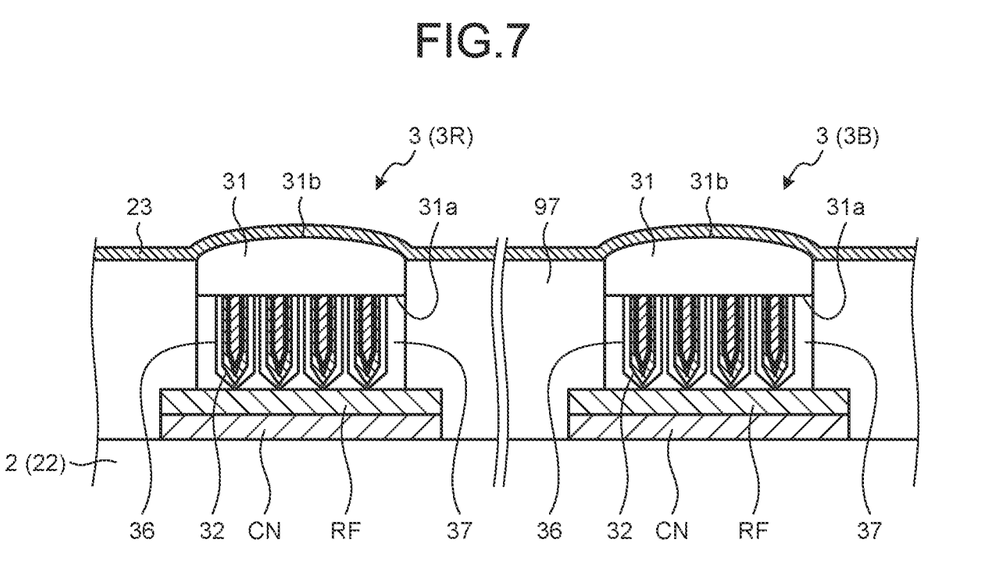
FIG. 7 is a sectional view schematically illustrating two light emitting elements adjacent to each other.

FIG. 7 is a sectional view schematically illustrating two light emitting elements adjacent to each other. As illustrated in FIG. 7, the second face 31b of the semiconductor substrate 31 protrudes in the third direction Dz from the upper face of the element insulating film 97. The upper face of the element insulating film 97 is provided to be flat between the light emitting elements 3 adjacent to each other. The element insulating film 97 is not limited to a configuration covering side faces of the contact layer 37 and the semiconductor substrate 31 and may also cover a peripheral part of the second face 31b. The cathode electrode 23 is provided along the convex shape of the second face 31b to have a shape convex in the third direction Dz.

The respective refractive indices of the protective layers 36, the contact layer 37, the element insulating film 97, and the cathode electrode 23 are smaller than the refractive index of GaN forming the semiconductor substrate 31, the n-type semiconductor 33, and the p-type semiconductor 35 of the light emitting element 3. The refractive index of GaN is approximately 2.4, for example. The refractive index of the protective layers 36 is approximately 2.0 to 2.1. The refractive index of the contact layer 37 is approximately 1.7 to 1.9. The refractive index of the element insulating film 97 is approximately 1.45 to 1.55. The refractive index of the cathode electrode 23 is approximately 1.7 to 1.9.

That is to say, the refractive index of the protective layers 36 is smaller than the refractive indices of the semiconductor substrate 31 and the semiconductor nanowires 32. The refractive index of the contact layer 37 is smaller than the refractive index of the protective layers 36. The refractive index of the element insulating film 97 is smaller than the refractive index of the contact layer 37. In the present embodiment, GaN, the protective layers 36, the contact layer 37, and the element insulating film 97 are arranged in descending order of the refractive index along the path of the light emitted from the semiconductor nanowires 32 toward the array substrate 2.

Thus, the difference in the refractive index between the layers is smaller than the difference in the refractive index between GaN and air (with a refractive index of 1). Compared with a supposed case in which GaN and air are provided in contact with each other, a critical angle at which total reflection occurs at interfaces between the layers can be increased. Thus, the display device 1 can prevent the light emitted from the semiconductor nanowires 32 from being totally reflected at the interfaces between the layers. Consequently, the display device 1 can improve the efficiency of extracting the light of the light emitting element 3.

First Modification

Figure 8:
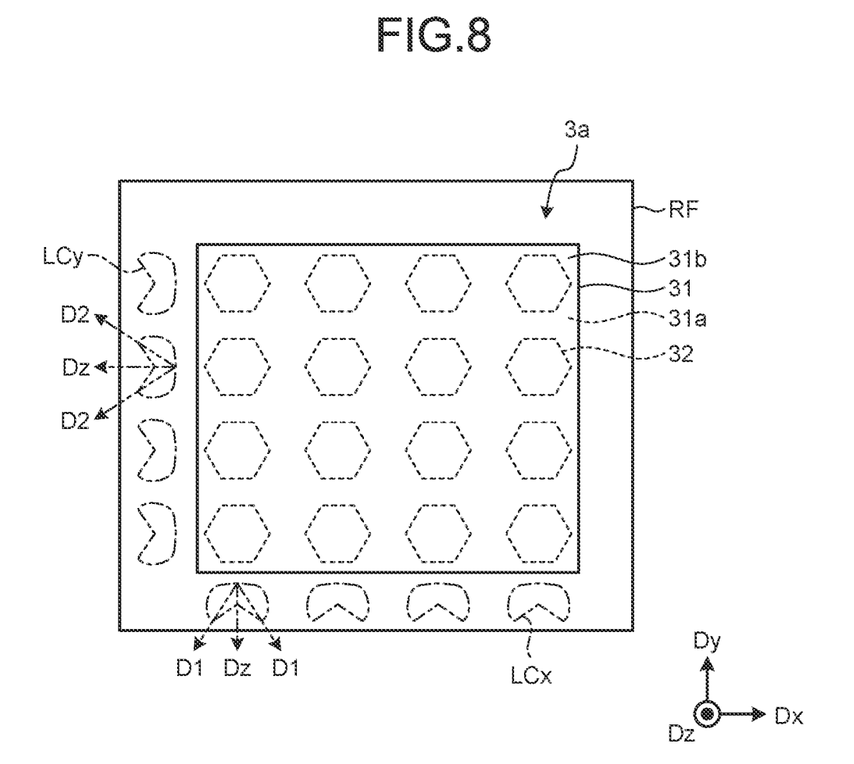
FIG. 8 is a plan view of a light emitting element according to a first modification.

FIG. 8 is a plan view of a light emitting element according to a first modification. In the following description, the same components as those described in the embodiment described above are denoted by the same symbols, and duplicate descriptions will be omitted.

As illustrated in FIG. 8, in this light emitting element 3a of the first modification, the semiconductor nanowires 32 are arranged in a matrix. That is to say, the semiconductor nanowires 32 are placed arranged in the first direction Dx and are placed arranged in the second direction Dy. Even with such placement, the light emitting element 3a complements the light of the semiconductor nanowires 32 in the third direction Dz to have a peak of light emission intensity at the central part of the semiconductor substrate 31 as a whole.

Second Modification

Figure 9:
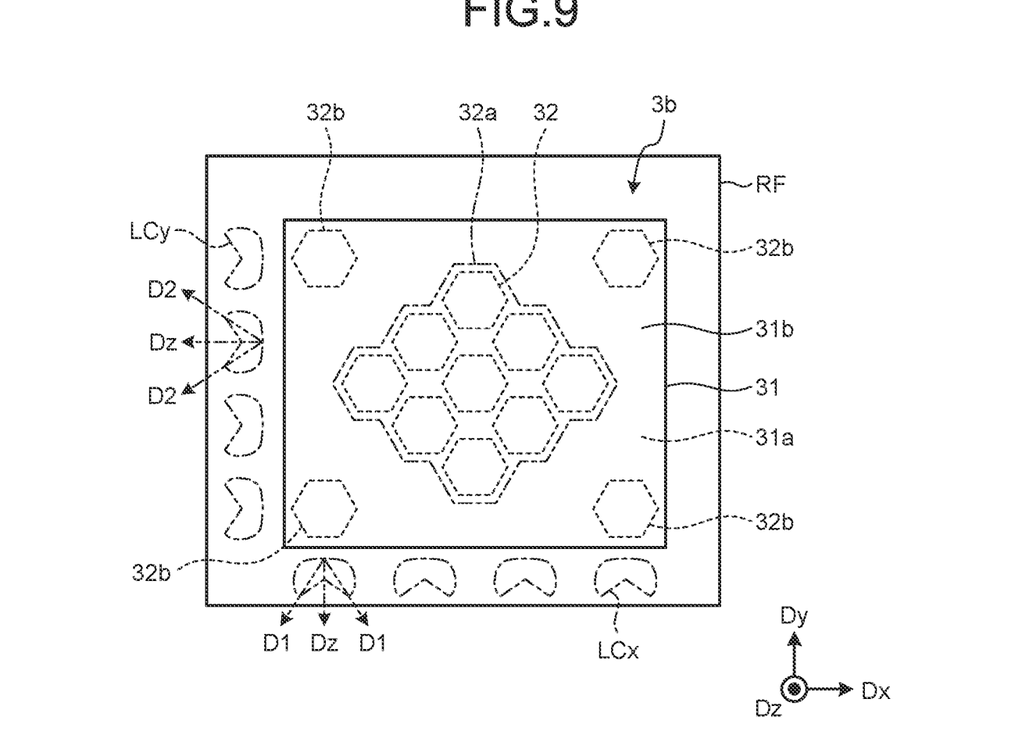
FIG. 9 is a plan view of a light emitting element according to a second modification.

FIG. 9 is a plan view of a light emitting element according to a second modification. As illustrated in FIG. 9, this light emitting element 3b of the second modification has a first group of semiconductor nanowires 32a and a second group of semiconductor nanowires 32b. The first group of semiconductor nanowires 32a include the semiconductor nanowires 32 provided at a central part of the first face 31a of the semiconductor substrate 31. The first group of semiconductor nanowires 32a have the semiconductor nanowires 32 placed in a zigzag manner.

The second group of semiconductor nanowires 32b include the semiconductor nanowires 32 placed at an outer edge of the semiconductor substrate 31. Specifically, the second group of semiconductor nanowires 32b have four semiconductor nanowires 32 placed at four corners of the semiconductor substrate 31.

With such a configuration, the first group of semiconductor nanowires 32a makes it possible for the light emitting element 3b to have light emission intensity at the central part of the semiconductor substrate 31. The light emitting element 3b can reduce the difference in the light emission intensity between the central part and the peripheral part of the semiconductor substrate 31 by the second group of semiconductor nanowires 32b.

The first group of semiconductor nanowires 32a may include the semiconductor nanowires 32 placed in a matrix. The second group of semiconductor nanowires 32b may have the semiconductor nanowires 32 placed along four sides of the semiconductor substrate 31.

Third Modification

Figure 10:
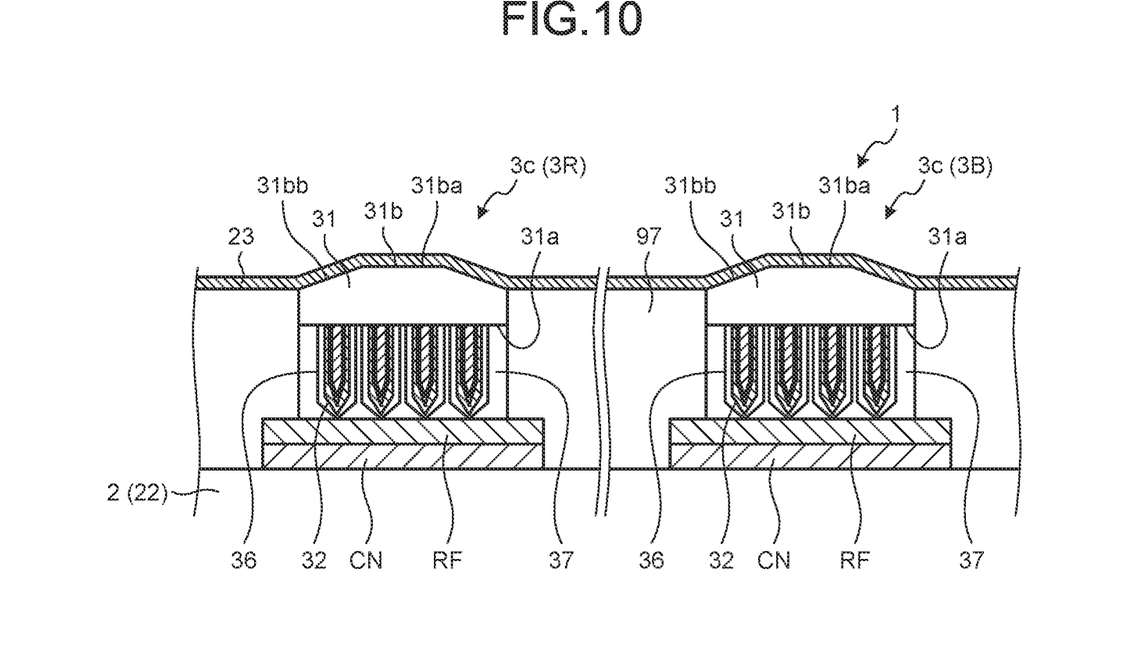
FIG. 10 is a sectional view schematically illustrating light emitting elements according to a third modification.

FIG. 10 is a sectional view schematically illustrating light emitting elements according to a third modification. As illustrated in FIG. 10, in this light emitting element 3c of the third modification, the second face 31b has a trapezoidal shape in cross-section. Specifically, the second face 31b has an upper face 31ba and an inclined face 31bb. The upper face 31ba is a face parallel to the first face 31a. The upper face 31ba is circular-shaped or rectangular-shaped in a plan view. The inclined face 31bb is provided inclined with respect to the upper face 31ba and couples the upper face 31ba and a side face of the light emitting element 3c to each other.

In the present modification as well, the travel direction of light passing through the inclined face 31bb of the semiconductor substrate 31 is directed to a direction parallel to the third direction Dz in accordance with the difference in the refractive index between the semiconductor substrate 31 and the cathode electrode 23 and the difference in the refractive index between the cathode electrode 23 and air.

Fourth Modification

Figure 11:
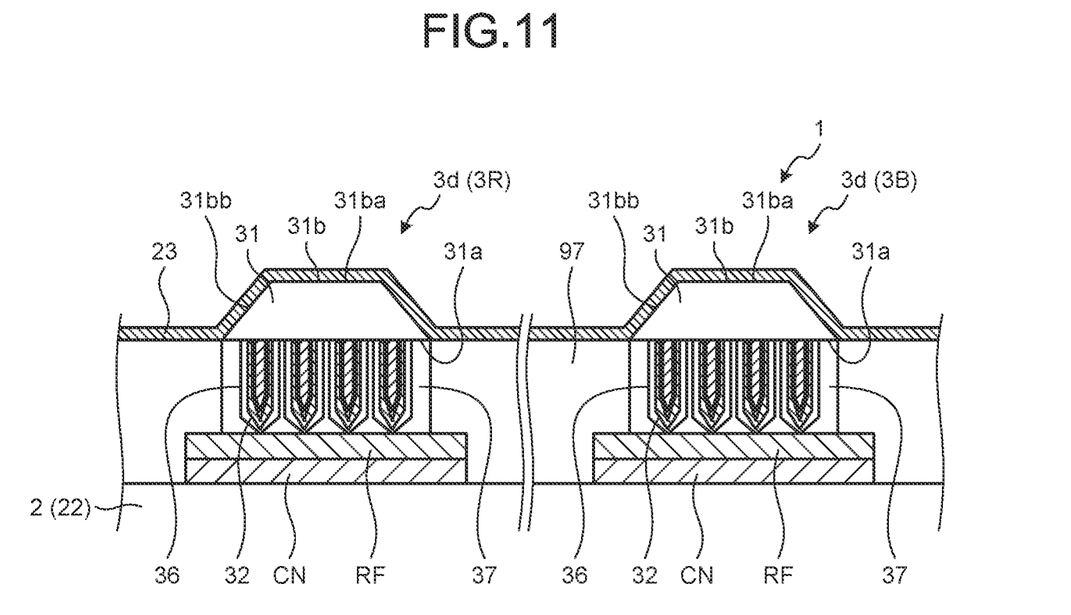
FIG. 11 is a sectional view schematically illustrating light emitting elements according to a fourth modification.

FIG. 11 is a sectional view schematically illustrating light emitting elements according to a fourth modification. As illustrated in FIG. 11, this light emitting element 3*d* of the fourth modification is different from the third modification described above in the configuration in which the inclined face 31*bb* couples the upper face 31*ba* and the first face 31*a* to each other. In other words, the semiconductor substrate 31 has no side face and has a conical shape or a pyramidal shape with its tip removed. The upper face 31*ba* is circular-shaped or rectangular-shaped in a plan view.

In the present modification, the semiconductor substrate 31 can be thinner than that of the third modification. The upper face of the element insulating film 97 is provided at the same height as the first face 31*a*. However, this is not limiting, and the element insulating film 97 may be provided so as to cover part of a lower end of the inclined face 31*bb*.

Fifth Modification

Figure 12:
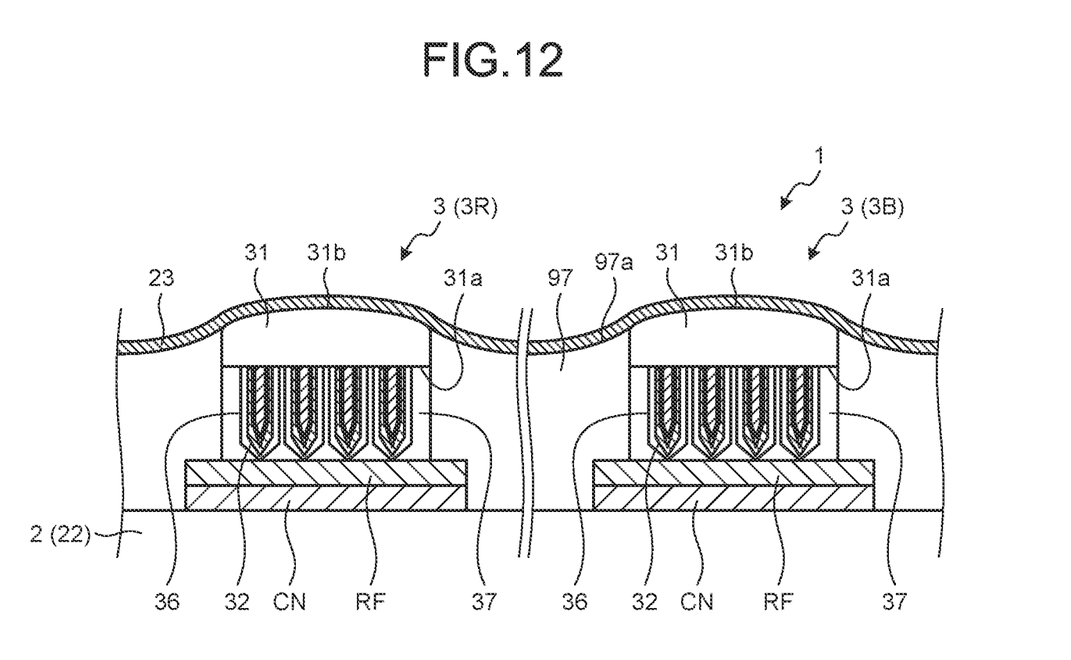
FIG. 12 is a sectional view schematically illustrating light emitting elements according to a fifth modification.

FIG. 12 is a sectional view schematically illustrating light emitting elements according to a fifth modification. As illustrated in FIG. 12, in the display device 1 of the fifth modification, an upper face 97*a* of the element insulating film 97 is provided in a concave shape recessed toward the array substrate 2 between the light emitting elements 3. The cathode electrode 23 is provided continuously across the second face 31*b* of the convex semiconductor substrate 31 and the upper face 97*a* of the concave element insulating film 97.

The travel direction of light reflected by the reflective plate RF and passing through the upper face 97*a* of the element insulating film 97 is directed to a direction parallel to the third direction Dz in accordance with the difference in the refractive index between the cathode electrode 23 and air. Thus, the fifth modification can inhibit color mixing of light between the light emitting elements 3 adjacent to each other. The display device 1 can efficiently extract the light reflected by the reflective plate RF toward the display face in addition to light passing through the semiconductor substrate 31.

Sixth Modification

Figure 13:
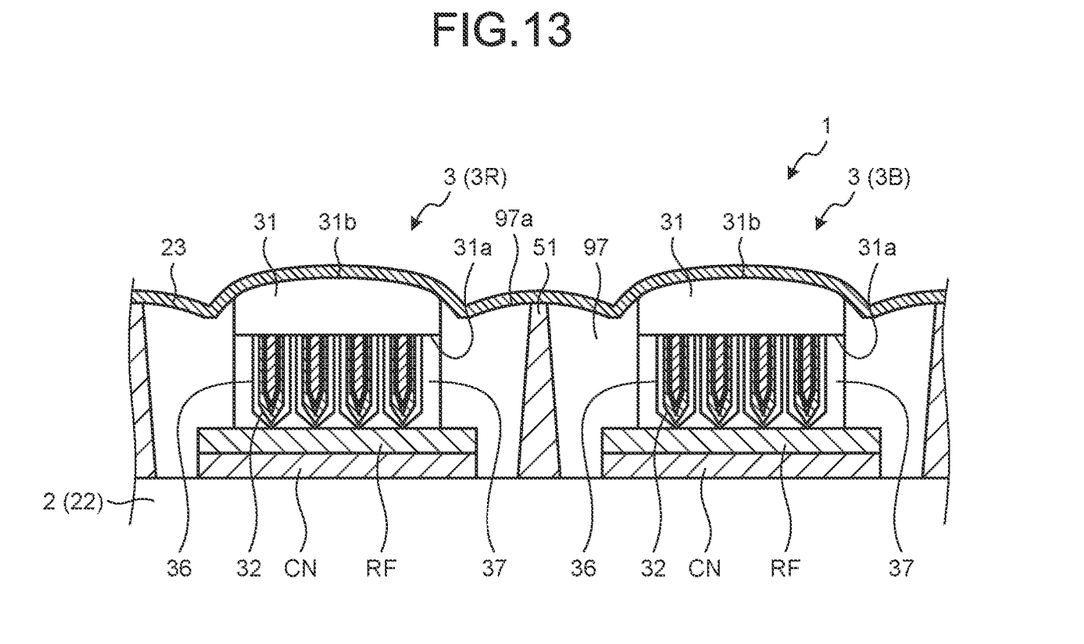
FIG. 13 is a sectional view schematically illustrating light emitting elements according to a sixth modification.

FIG. 13 is a sectional view schematically illustrating light emitting elements according to a sixth modification. As illustrated in FIG. 13, in the display device 1 of the sixth modification, a barrier 51 is provided between the light emitting elements 3 adjacent to each other. The barrier 51 is formed by a photolithographic technique using a photosensitive transparent insulating material having a higher refractive index than that of the element insulating film 97. Alternatively, the barrier 51 is formed by a photolithographic technique and wet etching using a light shielding material. The barrier 51 shields light between the light emitting elements 3 and can thus inhibit color mixing of light emitted from the light emitting elements 3.

An upper end part of the barrier 51 is provided at a higher position than the first face 31*a* of the semiconductor substrate 31. The element insulating film 97 is provided between the light emitting element 3 and the barrier 51 to cover the side faces of the light emitting element 3 and side faces of the barrier 51. The upper face 97*a* of the element insulating film 97 is provided in a convex shape with the upper end part of the barrier 51 as an apex between the light emitting elements 3 adjacent to each other. The cathode electrode 23 covers the convex second face 31*b*, the upper face 97*a* of the convex element insulating film 97, and the upper end part of the barrier 51. The upper face 97*a* of the element insulating film 97 is provided in a convex shape, and thus the light reflected by the reflective plate RF and passing through the upper face 97*a* of the element insulating film 97 is collected.

The configurations of the first modification to the sixth modification described above can be combined with each other as appropriate. The first modification and the second modification can be combined with any configuration of the third modification to the sixth modification. The third modification and the fourth modification can be combined with the configuration of the fifth modification or the sixth modification.

Second Embodiment

Figure 14:
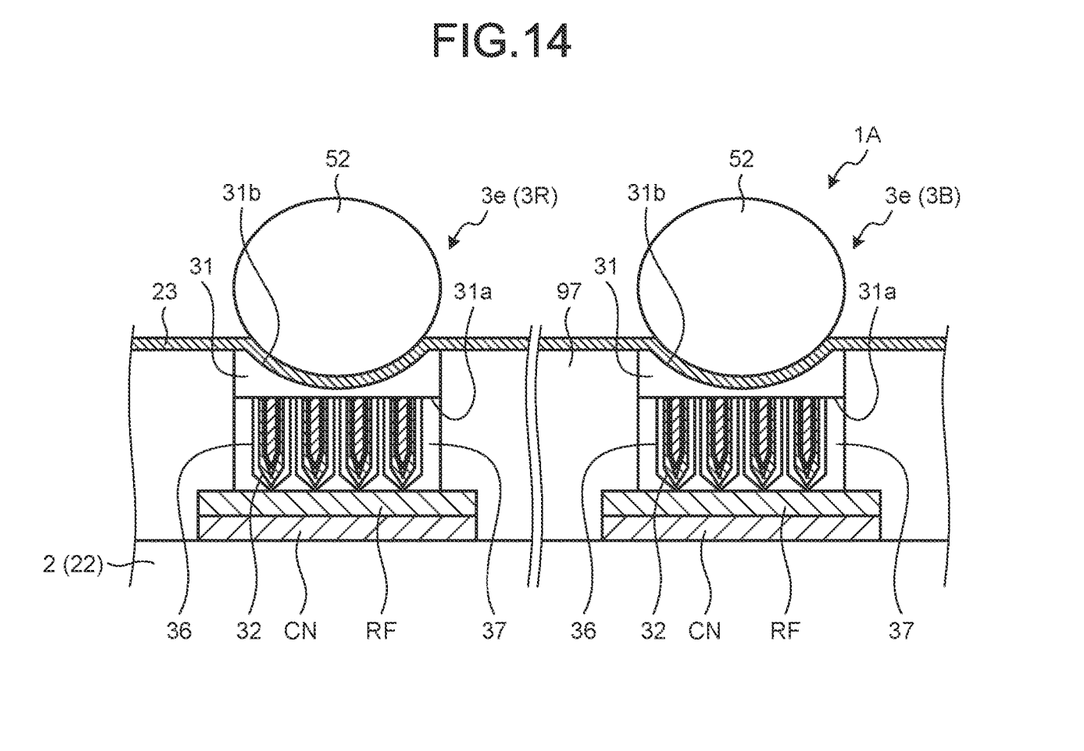
FIG. 14 is a sectional view schematically illustrating light emitting elements according to a second embodiment.

FIG. 14 is a sectional view schematically illustrating light emitting elements according to a second embodiment. As illustrated in FIG. 14, in this display device 1A of the second embodiment, the second face 31*b* of a light emitting element 3*e* is provided in a concave shape recessed toward the first face 31*a*. The display device 1A further has lens members 52 provided for respective light emitting elements 3*e*. A lens member 52 is a ball lens formed of glass.

The lens member 52 is formed above the second face 31*b* via the cathode electrode 23. The second face 31*b* has a curved face curved so as to follow the curved face of the lens member 52 and has a curvature comparable to that of the lens member 52. The lens member 52 is provided at a position overlapping with the semiconductor nanowires 32 in a plan view. The outer diameter of the lens member 52 is comparable to the width of the light emitting element 3*e*. However, the outer diameter of the lens member 52 may be different from the width of the light emitting element 3*e*.

The refractive index of the lens member 52 is approximately 1.45 to 1.55.

Thus, the light emitted from the semiconductor nanowires 32 in the third direction Dz passes through the second face 31*b* of the semiconductor substrate 31 and the lens member 52. The travel direction of the light is directed to a direction parallel to the third direction Dz in accordance with the difference in the refractive index between the lens member 52 and air. The second face 31*b* is provided in a concave shape, thus making it easy to position the lens members 52 with respect to the respective light emitting elements 3*e*.

Preferred embodiments of the present disclosure have been described; the present disclosure is not limited to such embodiments. The details disclosed in the embodiments are only by way of example, and various modifications can be in a range not departing from the gist of the present disclosure. Appropriate modifications made in the range not departing from the gist of the present disclosure also naturally belong to the technical scope of the present disclosure. In a range not departing from the gist of the embodiments and the modifications described above, at least one of various omissions, replacements, and modifications of the components can be made.

What is claimed is:
1. A display device comprising:
a substrate;
a plurality of pixels provided on the substrate;

a plurality of inorganic light emitting elements provided on each of the pixels; and a reflective plate provided on the substrate, wherein the inorganic light emitting elements each includes:

a semiconductor substrate having a first face facing the substrate and a second face provided in a convex shape on a side opposite from the first face;

a plurality of semiconductor nanowires provided on the first face, the semiconductor nanowires extending in a direction perpendicular to the first face;

protective layers covering the respective semiconductor nanowires; and     a contact layer covering the semiconductor nanowires and the protective layers provided on the first face, the contact layer is coupled onto the reflective plate, the protective layers include a transition metal oxide, lower ends of the protective layers are electrically coupled to the reflective plate, and in the contact layer, the protective layers entirely cover vertical sides and lower portions of the respective semiconductor nanowires, the lower portions facing the reflective plate.

2. The display device according to claim 1, wherein the protective layers have a refractive index smaller than a refractive index of the semiconductor nanowires, and the contact layer has a refractive index smaller than the refractive index of the protective layers.

3. The display device according to claim 1, further comprising:

an element insulating film provided between the inorganic light emitting elements; and     a translucent conductive film covering the inorganic light emitting elements and the element insulating film, the translucent conductive film being electrically coupled to the semiconductor substrate.

4. The display device according to claim 3, wherein an upper face of the element insulating film has a concave shape recessed toward the substrate between the inorganic light emitting elements.

5. The display device according to claim 1, wherein the semiconductor nanowires each have a hexagonal shape in a plan view in the direction perpendicular to the first face and are placed in a triangular grid on the first face.

6. The display device according to claim 1, wherein the semiconductor nanowires each have a hexagonal shape in a plan view in the direction perpendicular to the first face and are placed in a matrix on the first face.

7. The display device according to claim 1, wherein the semiconductor nanowires include a first group of semiconductor nanowires including the semiconductor nanowires provided at a central part of the first face and a second group of semiconductor nanowires including the semiconductor nanowires placed at an outer edge of the semiconductor substrate.

8. The display device according to claim 1, wherein the second face has a curved face curved in a convex shape.

9. The display device according to claim 1, wherein the semiconductor substrate has a trapezoidal shape in cross-section.

10. The display device according to claim 1, further comprising a barrier provided between the inorganic light emitting elements.

11. The display device according to claim 1, wherein the semiconductor nanowires each include     an n-type semiconductor extending in the direction perpendicular to the first face;

a p-type semiconductor provided at least on a side face of the n-type semiconductor; and     an active layer provided between the n-type semiconductor and the p-type semiconductor.

12. A display device comprising:

a substrate;

a plurality of pixels provided on the substrate;

a plurality of inorganic light emitting elements provided on each of the pixels;

lens members provided on the respective inorganic light emitting elements; and a reflective plate provided on the substrate, wherein the inorganic light emitting elements each includes:

a semiconductor substrate having a first face facing the substrate and a second face that is a face on a side opposite from the first face and provided in a concave shape toward the first face;

a plurality of semiconductor nanowires provided on the first face, the semiconductor nanowires extending in the direction perpendicular to the first face;

protective layers covering the respective semiconductor nanowires; and     a contact layer covering the semiconductor nanowires and the protective layers provided on the first face, the lens members are provided on the second face, the contact layer is coupled onto the reflective plate, the protective layers include a transition metal oxide, lower ends of the protective layers are electrically coupled to the reflective plate, and in the contact layer, the protective layers entirely cover vertical sides and lower portions of the respective semiconductor nanowires, the lower portions facing the reflective plate.

* * * * *